United States Patent
Kamata

(10) Patent No.: US 10,177,309 B1
(45) Date of Patent: Jan. 8, 2019

(54) MEMORY DEVICE

(71) Applicant: KABUSHIKI KAISHA TOSHIBA, Minato-ku (JP)

(72) Inventor: Yoshiki Kamata, Tsukuba (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/906,135

(22) Filed: Feb. 27, 2018

(30) Foreign Application Priority Data

Sep. 20, 2017 (JP) ................................. 2017-180744

(51) Int. Cl.
| | |
|---|---|
| H01L 29/02 | (2006.01) |
| H01L 45/00 | (2006.01) |
| H01L 27/24 | (2006.01) |
| G11C 13/00 | (2006.01) |

(52) U.S. Cl.
CPC .......... H01L 45/06 (2013.01); G11C 13/0004 (2013.01); H01L 45/1233 (2013.01); H01L 45/144 (2013.01); G11C 13/0069 (2013.01); H01L 27/2436 (2013.01)

(58) Field of Classification Search
CPC ... H01L 45/06; H01L 45/1233; H01L 45/144; H01L 27/2436; G11C 13/0004; G11C 13/0069
See application file for complete search history.

(56) References Cited

U.S. PATENT DOCUMENTS

2015/0349247 A1* 12/2015 Hidaka ................. H01L 45/144
257/4
2017/0229513 A1    8/2017 Kamata

FOREIGN PATENT DOCUMENTS

JP        2017-143153       8/2017

OTHER PUBLICATIONS

Janne Kalikka et al., "Strain-engineered diffusive atomic switching in two-dimensional crystals", nature communications, vol. 7, No. 11983, Jun. 22, 2016, pp. 8.
Kouichi Kifune et al., "Extremely long period-stacking structure in the Sb—Te binary system", Structural Science, Acta Crystallographica Section B, vol. 61, 2005, pp. 6.
Stefan Muff et al., "Separating the bulk and surface n- to p-type transition in the topological insulator $GeBi_{4-x}Sb_xTe_7$", Physical Review B, vol. 88, No. 3, Jul. 3, 2013, pp. 6.
T. Ohyanagi et al., "Charge-Injection Phase Change Memory with High-Quality $GeTe/Sb_2Te_3$ Superlattice Featuring 70-µA Reset, 10-ns SET and 100M Endurance Cycles Operations", 2013 IEEE International Electron Devices Meeting (IEDM), Dec. 2013, pp. 4.

(Continued)

*Primary Examiner* — Elias M Ullah
(74) *Attorney, Agent, or Firm* — Oblon, McClelland, Maier & Neustadt, L.L.P.

(57) ABSTRACT

According to one embodiment, a memory device includes a nonvolatile memory element including a stacked structure and having a first resistive state and a second resistive state having higher resistance than the first resistive state, the stacked structure including a first layer containing bismuth (Bi) and tellurium (Te) and a second layer containing germanium (Ge) and tellurium (Te).

17 Claims, 4 Drawing Sheets

(56) References Cited

OTHER PUBLICATIONS

Hiroki Shirakawa et al., "An amorphous-to-crystalline phase transition simulation for GeTe layers in GeTe/Sb2Te3 superlattices on the basis of first principles molecular dynamics", The 64th JSAP Spring Meeting 2017, Mar. 2017, pp. 3 (with English Translation).
R. E. Simpson et al., "Interfacial phase-change memory", nature nanotechnology, vol. 6, Jul. 2011, pp. 5.
Jinsong Zhang et al., "Band structure engineering in $(Bi_{1-x}Sb_x)_2Te_3$ ternary topological insulators" nature communications, vol. 2, No. 574, Dec. 2011, pp. 6.

\* cited by examiner

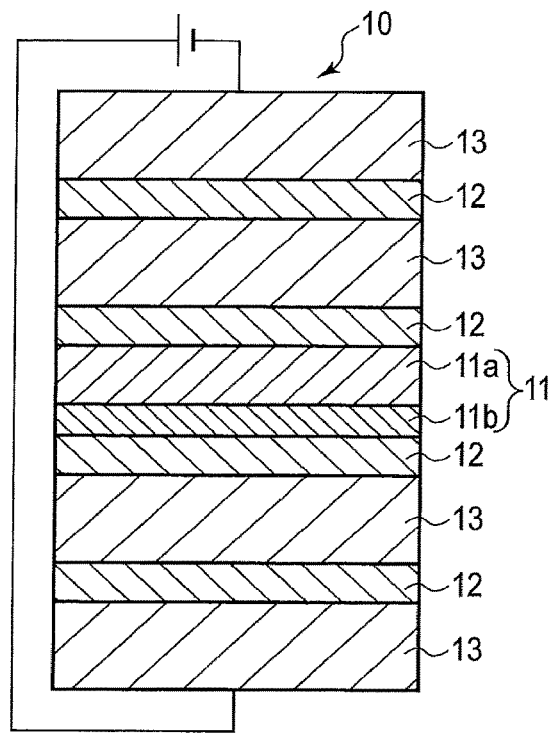
F I G. 7
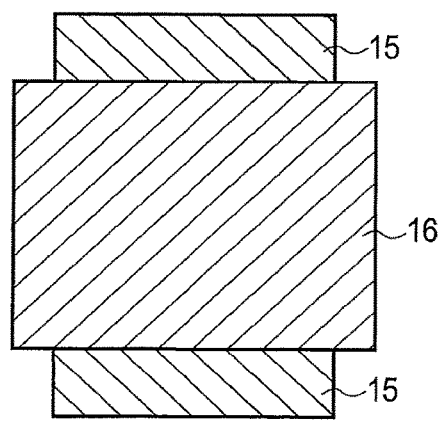
F I G. 8A
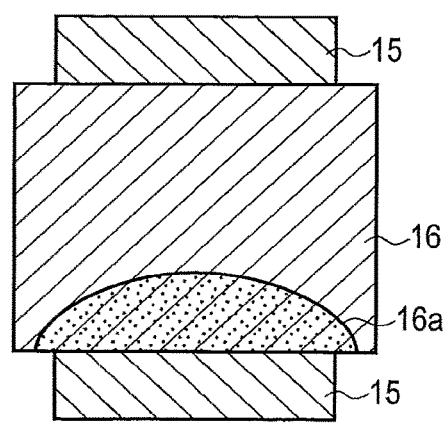
F I G. 8B

MEMORY DEVICE

CROSS-REFERENCE TO RELATED APPLICATIONS

This application is based upon and claims the benefit of priority from Japanese Patent Application No. 2017-180744, filed Sep. 20, 2017, the entire contents of which are incorporated herein by reference.

FIELD

Embodiments described herein relate generally to a memory device.

BACKGROUND

Memory devices (semiconductor integrated circuit devices) in which phase-change elements, which are nonvolatile memory elements, and transistors (or selectors) are integrated on a semiconductor substrate have been proposed. In general, such memory devices comprising phase-change elements are referred to as PCMs or PRAMs, which are the initials for phase-change memories or phase-change random access memories. Moreover, superlattice phase-change memories (superlattice memories, interfacial PCMs or iPCMs) in which GeTe and $Sb_2Te_3$, which are materials of phase-change elements of the PCMs, are stacked in layers have been proposed.

To increase the integration density of the PCMs (PRAMs) and the iPCMs, it is necessary to reduce the areas (footprints) of the transistors (or the selectors). However, when the areas are reduced, a driving force, that is, a driving current, decreases. It is therefore necessary that the resistance of phase-change materials be changeable even by a small driving current. A driving current is effectively made smaller by increasing the resistance of a resistance-change layer. In fact, it has been reported that in an iPCM, the lower the resistance in a SET state (low-resistive state) is, the smaller a necessary RESET current is. Heat is necessary when a PCM or an iPCM transitions between a low-resistive state (LRS) and a high-resistive state (HRS). Incidentally, in the case of a highly integrated element, heat produced at the time of writing may affect an adjacent cell to cause a writing error. It is therefore hard to prevent adjacent cells from interfering with each other in an element which produces much heat. Heat and power produced at the time of rewriting is proportional to $V^2/R$. Thus, with the same rewrite voltage, the higher the resistance is, the smaller the amount of produced heat is. The prevention of a writing error thereby can be expected. Therefore, memory devices comprising nonvolatile memory elements having high resistance have been desired.

An iPCM transitions between an LRS (SET) and an HRS (RESET) with a GeTe layer in a crystalline state. On the other hand, a superlattice-like phase-change memory (superlattice-like PCM or SLL-PCM) which transitions between an LRS and an HRS when a GeTe layer transitions between crystalline and noncrystalline states also has been proposed. It has been reported that in the SLL-PCM, biaxial strain occurring in an interface because of a difference in lattice constant between GeTe and $Sb_2Te_3$, etc., influences the movement of Ge, and the greater the strain is, the more easily Ge atoms move. The iPCM also transitions between LRS and HRS states because of the movement of Ge atoms. Thus, as in the case of the SLL-PCM, also in the iPCM, the application of strain to a GeTe layer facilitates the movement of Ge atoms and a SET/RESET operation. A reduction in operating temperature, that is, a reduction in current and power consumption in SET/RESET transition, thereby can be expected.

BRIEF DESCRIPTION OF THE DRAWINGS

FIG. 7 is a diagram schematically showing a structure of a second modification of the nonvolatile memory element in the memory device according to the second embodiment.

FIG. 8A is a diagram schematically showing a structure of a nonvolatile memory element in a memory device according to a third embodiment.

FIG. 8B is a diagram schematically showing a structure of a nonvolatile memory element in a memory device according to a third embodiment.

DETAILED DESCRIPTION

In general, according to one embodiment, a memory device includes a nonvolatile memory element including a stacked structure and having a first resistive state and a second resistive state having higher resistance than the first resistive state, the stacked structure including a first layer containing bismuth (Bi) and tellurium (Te) and a second layer containing germanium (Ge) and tellurium (Te).

Embodiments will be described hereinafter with reference to the accompanying drawings.

First Embodiment

Figure 1:
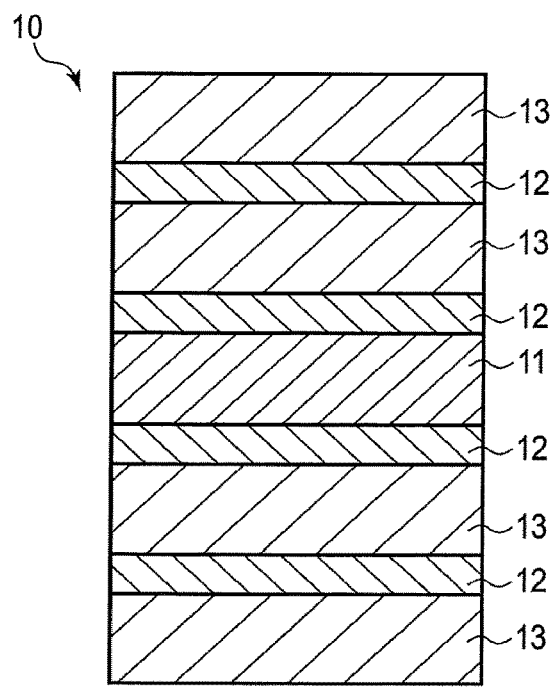
FIG. 1 is a diagram schematically showing a structure of a nonvolatile memory element in a memory device according to a first embodiment.

FIG. 1 is a diagram schematically showing a structure of a nonvolatile memory element in a memory device (semiconductor integrated circuit device) according to a first embodiment.

The nonvolatile memory element has a stacked structure 10, and is capable of having one of a low-resistive state and a high-resistive state selectively. The stacked structure 10 includes a first crystal layer (first layer) 11 containing antimony (Sb), bismuth (Bi), and tellurium (Te), second crystal layers (second layers) 12 containing germanium (Ge) and tellurium (Te), and third crystal layers (third layers) 13 containing antimony (Sb) and tellurium (Te), and second crystal layers 12 are located between the first crystal layer 11 and third crystal layers 13. Specifically, the basic structure of the stacked structure 10 is a superlattice structure in which the second crystal layers 12 and the third crystal layers 13 are alternately stacked, and in this basic structure, one of the third crystal layers 13 is replaced by the first crystal layer 11.

In the present embodiment, by virtue of the above-described stacked structure 10, the memory device comprising the nonvolatile memory element, which can have high resistance, can be obtained. Explanations are hereinafter added.

It has been known that a nonvolatile memory element having a superlattice structure in which antimony telluride ($Sb_2Te_3$) and germanium telluride (GeTe) are alternately stacked has one of a low-resistive state and a high-resistive state selectively by a change in a write signal (the magnitude of a write voltage and/or the waveform of a write voltage, etc.). Specifically, it has been considered that one of a low-resistive state and a high-resistive state is selectively exhibited by a change in the atomic position of germanium (Ge) in GeTe.

Figure 2:
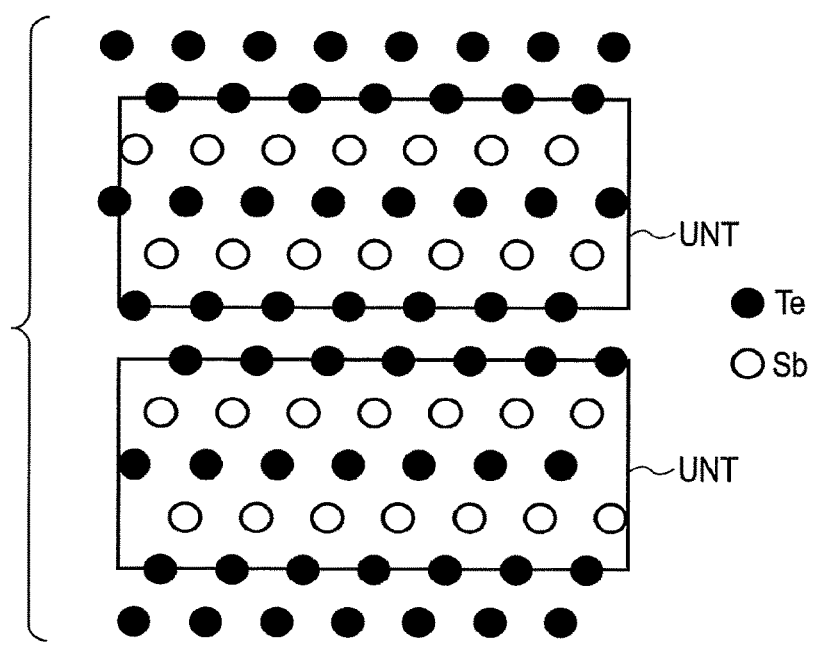
FIG. 2 is a diagram schematically showing a crystal structure of antimony telluride according to the first embodiment.

FIG. 2 is a diagram schematically showing a crystal structure of antimony telluride ($Sb_2Te_3$). As shown in FIG. 2, $Sb_2Te_3$ has a structure (quintuple layer or QL) consisting of five layers in which two atomic layers of Sb and three atomic layers of Te are alternately provided. A plurality of QLs are stacked. Each of the third crystal layers 13 shown in FIG. 1 also has a structure in which a plurality of QLs are stacked.

In the present embodiment, as described above, in the superlattice structure as the basic structure, in which the second crystal layers 12 containing germanium (Ge) and tellurium (Te) and the third crystal layers 13 containing antimony (Sb) and tellurium (Te) are alternately stacked, one of the third crystal layers 13 is replaced by the first crystal layer 11 containing antimony (Sb), bismuth (Bi), and tellurium (Te). Antimony (Sb) and bismuth (Bi) are homologous elements. Thus, even if one of the third crystal layers 13 is replaced by the first crystal layer 11, properties similar to the above-described properties of a nonvolatile memory element having a structure in which antimony telluride ($Sb_2Te_3$) and germanium telluride (GeTe) are alternately stacked can be achieved. That is, the nonvolatile memory element of the present embodiment also has one of a low-resistive state and a high-resistive state selectively by changing a write signal (the magnitude of a write voltage and/or the waveform of a write voltage, etc.). In other words, the atomic position of germanium (Ge) in the second crystal layers (GeTe layers) 12 is changed by executing a write, and one of a low-resistive state and a high-resistive state is selectively exhibited.

Figure 3:
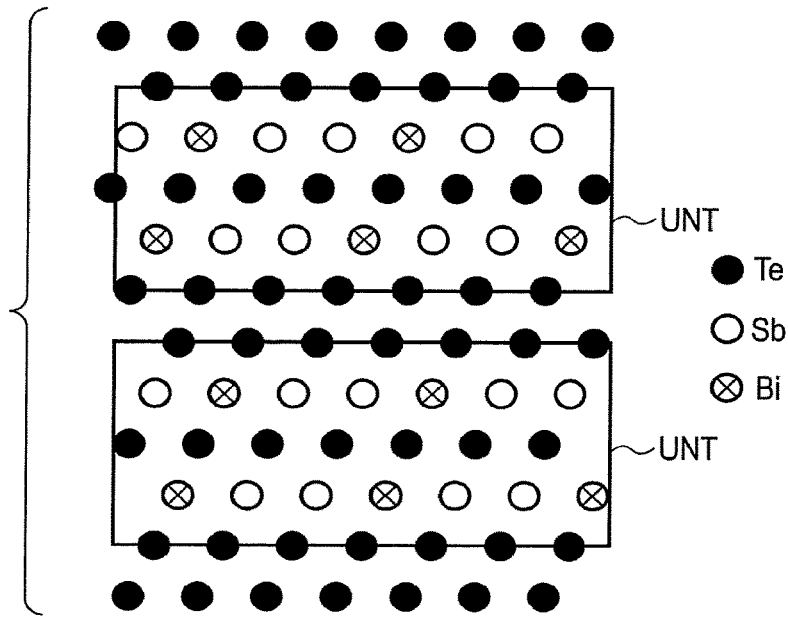
FIG. 3 is a diagram schematically showing a first structural example of a first crystal layer according to the first embodiment.

FIG. 3 is a diagram schematically showing a first structural example of the first crystal layer 11 according to the present embodiment. The first crystal layer 11 has a structure in which antimony (Sb), bismuth (Bi), and tellurium (Te) exist all over the first crystal layer 11. In the first structural example shown in FIG. 3, the first crystal layer 11 has a structure in which the atomic position of antimony (Sb) is replaced by bismuth (Bi). Thus, the first crystal layer 11 can be represented by $(Bi_xSb_{1-x})_2Te_3$. In this formula, $0<x\leq1$. That is, it suffices if the first crystal layer 11 contains at least bismuth (Bi) and tellurium (Te), and antimony (Sb) may not necessarily be contained. The above-described first structural example can be formed by performing sputter deposition, using a target containing antimony (Sb), bismuth (Bi), and tellurium (Te). In the first crystal layer 11 represented by $(Bi_xSb_{1-x})_2Te_3$, the value of x is set to, for example, approximately 0.04 to 0.06 for the reason explained hereinafter.

In general, $Sb_2Te_3$ is a p-type semiconductor. On the other hand, $(Bi_xSb_{1-x})_2Te_3$ represents an n-type semiconductor, a p-type semiconductor, or an intrinsic semiconductor having few conductive carriers and high resistance in accordance with the value of x. The resistance in the case where the value of x is not zero, that is, the resistance of $(Bi_xSb_{1-x})_2Te_3$, where $0<x\leq1$, which contains even a little Bi, is higher than the resistance of $Sb_2Te_3$. If $0<x\leq0.04$, $(Bi_xSb_{1-x})_2Te_3$ is a p-type semiconductor, and if $0.06\leq x\leq1$, $(Bi_xSb_{1-x})_2Te_3$ is an n-type semiconductor. In particular, although there are variations in numerical values, if the value of x is approximately 0.04 to 0.06, $(Bi_xSb_{1-x})_2Te_3$ is an intrinsic semiconductor, and has sufficiently high resistance.

As is clear from the above description, $(Bi_xSb_{1-x})_2Te_3$ can have higher resistance than $Sb_2Te_3$. Therefore, if $(Bi_xSb_{1-x})_2Te_3$ is included in a stacked structure, the nonvolatile memory element having sufficiently high resistance can be achieved.

In the present embodiment, the stacked structure 10 includes the first crystal layer ($(Bi_xSb_{1-x})_2Te_3$) 11 containing antimony (Sb), bismuth (Bi), and tellurium (Te), the second crystal layers (GeTe) 12 containing germanium (Ge) and tellurium (Te), and the third crystal layers ($Sb_2Te_3$) 13 containing antimony (Sb) and tellurium (Te). Accordingly, a nonvolatile memory element which has sufficiently high resistance can be achieved for the above-explained reason.

In addition, as has been already described, the nonvolatile memory element of the present embodiment can achieve properties similar to those of a nonvolatile memory element having a structure in which antimony telluride ($Sb_2Te_3$) and germanium telluride (GeTe) are alternately stacked. Therefore, one of a low-resistive state and a high-resistive state is selectively exhibited by changing a write signal (the magnitude of a write voltage and/or the waveform of a write voltage, etc.).

In view of the above, according to the present embodiment, it is possible to achieve a nonvolatile memory element which has a low-resistive state and a high-resistive state selectively and further has sufficiently high resistance. It is therefore possible to achieve an excellent nonvolatile memory element capable of reducing a write current and preventing adjacent cells from interfering with each other.

In addition, a lattice constant LA of $Bi_2Te_3$, a lattice constant LB of $Sb_2Te_3$, and a lattice constant LC of GeTe have the following relation: LA>LB>LC. Thus, when a lattice constant L1 of the first crystal layer ($(Bi_xSb_{1-x})_2Te_3$) 11, a lattice constant L2 of the second crystal layers (GeTe) 12, and a lattice constant L3 of the third crystal layers ($Sb_2Te_3$) 13 are compared, the following relation holds: L1>L3>L2. Therefore, because of a difference in lattice constant, a distortion in crystals is caused, and germanium (Ge) atoms easily move. As has been already described, the nonvolatile memory element of the present embodiment has one of a low-resistive state and a high-resistive state selectively by a change in the atomic position of germanium (Ge) in GeTe. Therefore, in the nonvolatile memory element of the present embodiment, since germanium (Ge) atoms easily move, the transition between a low-resistive state and a high-resistive state is facilitated, and a low-temperature operation and a low-current operation can be performed.

Figure 4:
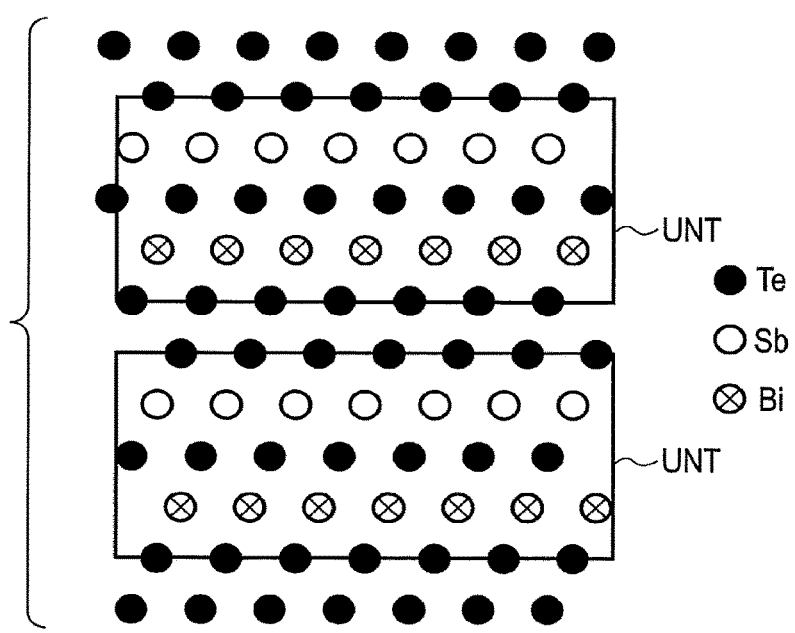
FIG. 4 is a diagram schematically showing a second structural example of the first crystal layer according to the first embodiment.

FIG. 4 is a diagram schematically showing a second structural example of the first crystal layer 11 according to the present embodiment. Also in the present structural example, the first crystal layer 11 has a structure in which antimony (Sb), bismuth (Bi) and tellurium (Te) exist all over the first crystal layer 11. However, in the present structural example, the first crystal layer 11 has a structure in which an atomic layer of antimony (Sb) is replaced by an atomic layer of bismuth (Bi). Also in the present structural example, as in the case of the first structural example shown in FIG. 3, the first crystal layer 11 can be represented by $(Bi_xSb_{1-x})_2Te_3$.

Also in the second structural example, for the same reason as in the first structural example, it is possible to achieve a nonvolatile memory element which can have a low-resistive state and a high-resistive state selectively and further has sufficiently high resistance.

In addition, although one first crystal layer 11 is provided in the stacked structure 10 in the above-described embodiment, two or more first crystal layers 11 may be provided in the stacked structure 10.

Moreover, in a high-resistive state, at least parts of the crystal layers 12 may be amorphous. That is, in the above-described embodiment, the case of an iPCM in which a GeTe layer is in a crystalline state also in an HRS has been described. However, a memory cell having sufficiently high resistance can be achieved also in the case of an SLL-PCM in which a GeTe layer is in an amorphous state in an HRS.

Regarding the number of layers of $(Bi_xSb_{1-x})_2Te_3$, one QL or four QLs are used in many cases. However, two QLs, three QLs, or five or more QLs may be used.

In an iPCM and an SLL-PCM, Ge atoms move at the time of a SET/RESET operation, and thus, the constituent atoms of an $Sb_2Te_3$ layer and a $(Bi_xSb_{1-x})_2Te_3$ layer and the constituent atoms of a GeTe layer may diffuse mutually. That is, some Ge in the GeTe layer may be replaced by Sb and Bi, and some Sb and Bi in the $Sb_2Te_3$ layer and the $(Bi_xSb_{1-x})_2Te_3$ layer may be replaced by Ge. In the above-described embodiment, it has been explained that if Ge is not contained in the $(Bi_xSb_{1-x})_2Te_3$ layer, $(Bi_xSb_{1-x})_2Te_3$, where the value of x is approximately 0.04 to 0.06, is an intrinsic semiconductor and has high resistance. On the other hand, if Ge is contained, for example, if the ratio between GeTe and $(Bi_xSb_{1-x})_2Te_3$ is 1:2, that is, in the case of $Ge(Bi_xSb_{1-x})_4Te_7$, $Ge(Bi_xSb_{1-x})_4Te_7$, where x is approximately 0.85, is an intrinsic semiconductor and can have high resistance. Therefore, if $GeTe/(Bi_xSb_{1-x})_2Te_3$ is 0 to 1/3, it is preferable that x be 0.04 to 0.85. If $GeTe/(Bi_xSb_{1-x})_2Te_{3>1/3}$, it is preferable that x be 0.85 to 1.

As described above, if Ge, and Sb and Bi mutually diffuse, a memory cell having high resistance can be achieved if x>y, where an area close to a GeTe layer containing much Ge is $(Bi_xSb_{1-x})_2Te_3$, and a distant area is $(Bi_ySb_{1-y})_2Te_3$. In particular, those similar to the composition in which x=0.85 and y=0.05 are preferable. Considering that Bi and Sb mutually diffuse, a memory cell having high resistance can be achieved also if a $Bi_2Te_3$ layer is interposed between a GeTe layer and an $Sb_2Te_3$ layer.

Second Embodiment

Figure 5:
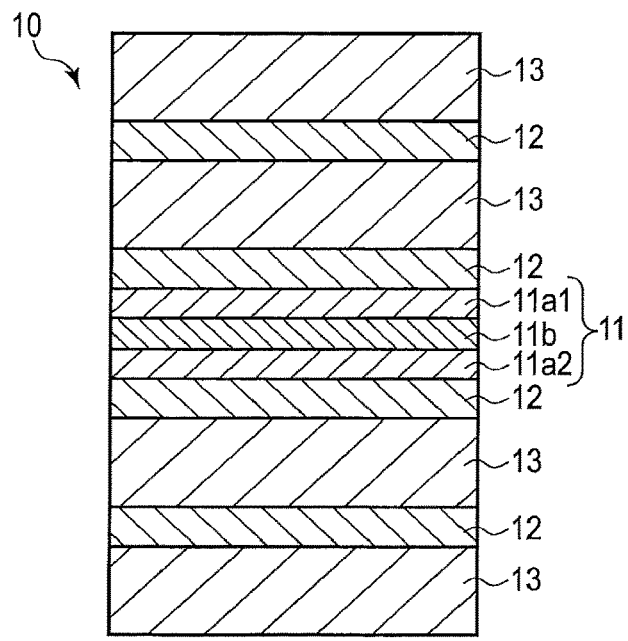
FIG. 5 is a diagram schematically showing a structure of a nonvolatile memory element in a memory device according to a second embodiment.

FIG. 5 is a diagram schematically showing a structure of a nonvolatile memory element in a memory device (semiconductor integrated circuit device) according to a second embodiment. Since the basic matters are similar to those in the first embodiment, a description of the matters described in the first embodiment is omitted.

As in the case of the first embodiment, the nonvolatile memory element of the present embodiment has a stacked structure 10, and is capable of having one of a low-resistive state and a high-resistive state selectively. The stacked structure 10 includes a first crystal layer (first layer) 11 containing antimony (Sb), bismuth (Bi), and tellurium (Te), second crystal layers (second layers) 12 containing germanium (Ge) and tellurium (Te), and third crystal layers (third layers) 13 containing antimony (Sb) and tellurium (Te), and the second crystal layer 12 is located between the first crystal layer 11 and third crystal layers 13. Specifically, the basic structure of the stacked structure 10 is a superlattice structure in which the second crystal layers 12 and the third crystal layers 13 are alternately stacked, and in this basic structure, one of the third crystal layers 13 is replaced by the first crystal layer 11.

As described above, also in the present embodiment, as in the case of the first embodiment, in the superlattice structure as the basic structure, in which the second crystal layers 12 containing germanium (Ge) and tellurium (Te) and the third crystal layers 13 containing antimony (Sb) and tellurium (Te) are alternately stacked, one of the third crystal layers 13 is replaced by the first crystal layer 11 containing antimony (Sb), bismuth (Bi), and tellurium (Te). Therefore, for the same reason as that explained in the first embodiment, it is considered that properties similar to those of a nonvolatile memory element having a structure in which antimony telluride ($Sb_2Te_3$) and germanium telluride (GeTe) are alternately stacked can be achieved. That is, it is considered that the nonvolatile memory element of the present embodiment also has one of a low-resistive state and a high-resistive state selectively by changing a write signal (the magnitude of a write voltage and/or the waveform of a write voltage, etc.).

In addition, in the present embodiment, the first crystal layer 11 includes first crystal sub-layers (first sub-layers) 11a1 and 11a2 formed of antimony (Sb) and tellurium (Te), and a second crystal sub-layer (second sub-layer) 11b provided between the first crystal sub-layers 11a1 and 11a2 and formed of bismuth (Bi) and tellurium (Te). In the present embodiment, by virtue of the above-described stacked structure 10, the memory device comprising the nonvolatile memory element, which can have sufficiently high resistance, can be obtained. Explanations are hereinafter added.

As has been already described, $Sb_2Te_3$ is a p-type semiconductor. In contrast, $Bi_2Te_3$ is an n-type semiconductor. Therefore, a pn junction is formed by stacking an $Sb_2Te_3$ layer and a $Bi_2Te_3$ layer adjacently. As shown in FIG. 5, one of a pn junction between the first crystal sub-layer 11a1 and the second crystal sub-layer 11b and a pn junction between the first crystal sub-layer 11a2 and the second crystal sub-layer 11b is necessarily set in a reverse bias state by providing the second crystal sub-layer ($Bi_2Te_3$ layer) 11b between the first crystal sub-layers ($Sb_2Te_3$ layers) 11a1 and 11a2. The stacked structure 10 of the present embodiment includes such a reverse bias state, and thus, the nonvolatile memory element having high resistance can be obtained.

In view of the above, also in the present embodiment, as in the case of the first embodiment, it is possible to achieve a nonvolatile memory element which can have one of a low-resistive state and a high-resistive state selectively and further has sufficiently high resistance. It is therefore possible to achieve an excellent nonvolatile memory element capable of reducing a write current and preventing adjacent cells from interfering with each other.

In the above-described embodiment, it has been explained that the layers 11a1 and 11a2 are $Sb_2Te_3$ layers and the layer 11b is a $Bi_2Te_3$ layer. However, as is clear from the above discussion on pn junctions, even if the layers 11a1 and 11a2 are $Bi_2Te_3$ layers and the layer 11b is an $Sb_2Te_3$ layer, a pn junction to which a reverse bias is applied is necessarily included. Thus, a nonvolatile memory element having sufficiently high resistance can be similarly achieved.

Figure 6:
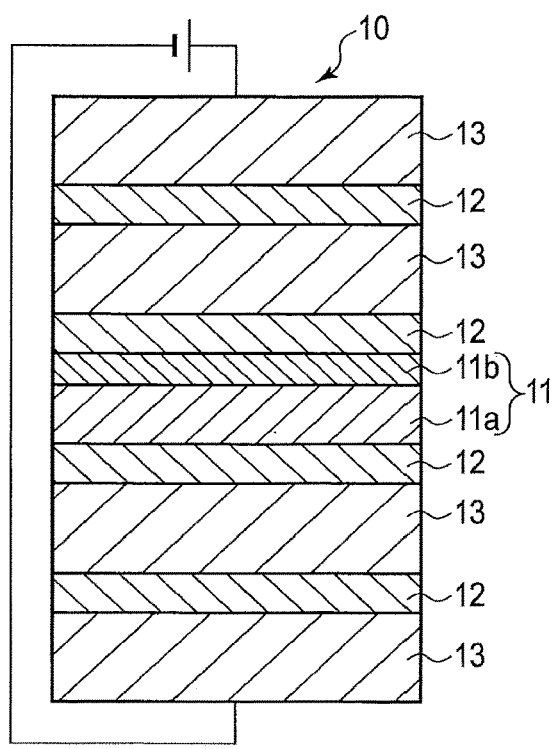
FIG. 6 is a diagram schematically showing a structure of a first modification of the nonvolatile memory element in the memory device according to the second embodiment.

FIG. 6 is a diagram schematically showing the stacked structure of the nonvolatile memory element according to a first modification of the present embodiment.

In the present modification, the first crystal layer 11 has a structure in which a first crystal sub-layer 11a formed of antimony (Sb) and tellurium (Te) and the second crystal sub-layer 11b formed of bismuth (Bi) and tellurium (Te) are stacked. More specifically, in the present modification, the second crystal sub-layer 11b is provided closer to the upper layer side than the first crystal sub-layer 11a. Also in the present modification, by virtue of the above-described stacked structure 10, the memory device comprising the nonvolatile memory element, which can have sufficiently high resistance, can be obtained. Explanations are hereinafter added.

As has been already described, a pn junction is formed by stacking an $Sb_2Te_3$ layer and a $Bi_2Te_3$ layer adjacently. In the present modification, when a write is executed, a positive voltage is applied to the upper layer side with respect to the lower layer side as shown in FIG. 6. That is, a positive voltage is applied to the second crystal sub-layer ($Bi_2Te_3$ layer) 11b side with respect to the first crystal sub-layer ($Sb_2Te_3$ layer) 11a side. A pn junction formed between the first crystal sub-layer ($Sb_2Te_3$ layer) 11a and the second crystal sub-layer ($Bi_2Te_3$ layer) 11b is thereby set to a reverse bias state. Thus, the stacked structure 10 of the present modification also can have a high-resistive state when a write is executed.

On the other hand, since a GeTe layer on an $Sb_2Te_3$ crystal is a p-type, even if the layers 11a and 11b shown in FIG. 6 are $Bi_2Te_3$ and $Sb_2Te_3$ layers, respectively, a pn junction formed between the $Bi_2Te_3$ layer of the layer 11a and the GeTe layer of the layer 12 under the layer 11a is in a reverse bias state. Thus, at the time of a bias state shown in FIG. 6 in which a write is executed, a high-resistive state can be exhibited.

In view of the above, also in the present modification, the same advantages as those of the above-described embodiment can be obtained, and an excellent nonvolatile memory element can be achieved.

FIG. 7 is a diagram schematically showing the stacked structure of the nonvolatile memory element according to a second modification of the present embodiment.

The present modification is basically the same as the first modification, and the first crystal layer 11 has a structure in which the first crystal sub-layer 11a formed of antimony (Sb) and tellurium (Te) and the second crystal sub-layer 11b formed of bismuth (Bi) and tellurium (Te) are stacked. More specifically, in the present modification, the second crystal sub-layer 11b is provided closer to the lower layer side than the first crystal sub-layer 11a.

In the present modification, when a write is executed, a positive voltage is applied to the lower layer side with respect to the upper layer side as shown in FIG. 7. That is, as in the case of the first modification, a positive voltage is applied to the second crystal sub-layer ($Bi_2Te_3$ layer) 11b side with respect to the first crystal sub-layer ($Sb_2Te_3$ layer) 11a side. A pn junction formed between the first crystal sub-layer ($Sb_2Te_3$ layer) 11a and the second crystal sub-layer ($Bi_2Te_3$ layer) 11b is thereby set in a reverse bias state. Thus, the stacked structure 10 of the present modification also can have a high-resistive state when a write is executed.

In FIG. 6 and FIG. 7, circuit symbols for DC power source are used to simply illustrate the positive and negative directions. However, in general, SET and RESET are switched by a pulse signal. Therefore, it should be noted that the symbols for DC power source in the figures originally represent pulse power sources.

In view of the above, also in the present modification, the same advantages as those of the above-described embodiment can be obtained, and an excellent nonvolatile memory element can be achieved.

In the above-described stacked structures of the first and second embodiments, the same advantages can be expected, even if there is much Sb, Bi, Te or Ge. Specifically, even if each layer deviates from the combination of GeTe and $(Bi_xSb_{1-x})_2Te_3$, a layer of many atoms is merely laid on a stacked structure of GeTe and $(Bi_xSb_{1-x})_2Te_3$, as explained in a document in which a stacked structure including $Sb_2Te_3$ with excessive Sb is reported.

Third Embodiment

FIGS. 8A and 8B are a diagram schematically showing a structure of a nonvolatile memory element in a memory device (semiconductor integrated circuit device) according to a third embodiment. Since the basic matters are similar to those in the first and second embodiments, a description of the matters described in the first and second embodiments is omitted.

FIG. 8A shows the nonvolatile memory element in a low-resistive state, and FIG. 8B shows the nonvolatile memory element in a high-resistive state. The nonvolatile memory element of the present embodiment has a structure in which a phase-change layer 16 is provided between electrodes 15. The phase-change layer 16 can be represented by $(Bi_xSb_{1-x})_2Te_3$. In this formula, $0<x\leq1$. That is, it suffices if a first crystal layer 11 contains at least bismuth (Bi) and tellurium (Te), and antimony (Sb) may not necessarily be contained. As shown in FIG. 8A, in a low-resistive state, all the phase-change layer 16 is in a crystalline state. In contrast, in a high-resistive state, a part 16a of the phase-change layer 16 is in an amorphous state. Specifically, in a high-resistive state, an area near one of the electrodes 15 is in an amorphous state, and the other area is in a crystalline state.

As has been already described, if the phase-change layer 16 is represented by $(Bi_xSb_{1-x})_2Te_3$, the resistance is higher in the case where Bi is contained in $Sb_2Te_3$ than in the case where Bi is not contained. If $0<x\leq0.04$, $(Bi_xSb_{1-x})_2Te_3$ is a p-type semiconductor, and if $0.06\leq x\leq1$, $(Bi_xSb_{1-x})_2Te_3$ is an n-type semiconductor. Although there are variations in numerical values, if the value of x is approximately 0.04 to 0.06, $(Bi_xSb_{1-x})_2Te_3$ is an intrinsic semiconductor. That is, if the value of x is approximately 0.04 to 0.06, $(Bi_xSb_{1-x})_2Te_3$ has sufficient high resistance, and can perform a low-current operation.

The phase-change layer 16 may further contain Ge in addition to Bi, Sb, and Te. For example, $GeBi_{3.4}Sb_{0.6}Te_7$ is similar to an intrinsic semiconductor, and thus, has sufficiently high resistance and can perform a low-current operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising a nonvolatile memory element including a stacked structure and having a first resistive state and a second resistive state having higher resistance than the first resistive state, the stacked structure including a first layer containing bismuth (Bi) and tellurium (Te) and a second layer containing germanium (Ge) and tellurium (Te), wherein the first layer is formed of a material represented by $(Bi_xSb_{1-x})_2Te_3$, where $0<x\leq1$, and having a structure in which at least one of antimony (Sb) atoms of a material represented by $Sb_2Te_3$ is replaced by a bismuth (Bi) atom.

2. The memory device of claim 1, wherein the stacked structure further includes a third layer containing antimony (Sb) and tellurium (Te), and
the second layer is located between the first layer and the third layer.

3. The memory device of claim 1, wherein the first layer has a structure in which bismuth (Bi) and tellurium (Te) exist all over the first layer.

4. The memory device of claim 1, wherein x is 0.04 to 0.06.

5. The memory device of claim 1, wherein the first layer has a structure in which at least one of atomic layers of antimony (Sb) of a material represented by $Sb_2Te_3$ is replaced by an atomic layer of bismuth (Bi).

6. The memory device of claim 1, wherein the first layer includes first sub-layers formed of antimony (Sb) and tellurium (Te), and a second sub-layer provided between the first sub-layers and formed of bismuth (Bi) and tellurium (Te).

7. The memory device of claim 1, wherein the first layer has a structure in which a first sub-layer formed of antimony (Sb) and tellurium (Te) and a second sub-layer formed of bismuth (Bi) and tellurium (Te) are stacked.

8. The memory device of claim 7, wherein a positive voltage is applied to the second sub-layer with respect to the first sub-layer when a write to the nonvolatile memory element is executed.

9. The memory device of claim 1, wherein an atomic position of germanium (Ge) in the second layer when the nonvolatile memory element is in the first resistive state is different from an atomic position of germanium (Ge) in the second layer when the nonvolatile memory element is in the second resistive state.

10. A memory device comprising a nonvolatile memory element including a stacked structure and having a first resistive state and a second resistive state having higher resistance than the first resistive state, the stacked structure including a first layer containing bismuth (Bi) and tellurium (Te) and a second layer containing germanium (Ge) and tellurium (Te),
wherein the first layer is represented by $(Bi_xSb_{1-x})_2Te_3$, where a value of x ranges from 0.04 to 0.06.

11. The memory device of claim 10, wherein the stacked structure further includes a third layer containing antimony (Sb) and tellurium (Te), and
the second layer is located between the first layer and the third layer.

12. The memory device of claim 10, wherein the first layer has a structure in which bismuth (Bi) and tellurium (Te) exist all over the first layer.

13. The memory device of claim 10, wherein the first layer includes first sub-layers formed of antimony (Sb) and tellurium (Te), and a second sub-layer provided between the first sub-layers and formed of bismuth (Bi) and tellurium (Te).

14. The memory device of claim 10, wherein the first layer has a structure in which a first sub-layer formed of antimony (Sb) and tellurium (Te) and a second sub-layer formed of bismuth (Bi) and tellurium (Te) are stacked.

15. The memory device of claim 14, wherein a positive voltage is applied to the second sub-layer with respect to the first sub-layer when a write to the nonvolatile memory element is executed.

16. The memory device of claim 10, wherein an atomic position of germanium (Ge) in the second layer when the nonvolatile memory element is in the first resistive state is different from an atomic position of germanium (Ge) in the second layer when the nonvolatile memory element is in the second resistive state.

17. A memory device comprising a nonvolatile memory element including a structure having a first resistive state and a second resistive state having higher resistance than the first resistive state,
wherein the structure includes a region containing bismuth (Bi) and tellurium (Te), and
the region includes an amorphous region in the second resistive state, and
the region is represented by $(Bi_xSb_{1-x})_2Te_3$, where a value of x ranges from 0.04 to 0.06.

* * * * *